United States Patent [19]

Risch et al.

[11] 4,390,888
[45] Jun. 28, 1983

[54] X-Y INFRARED CCD SENSOR AND METHOD FOR MAKING SAME

[75] Inventors: Lothar Risch, Ottobrunn; Hermann Mader, Unterhaching, both of Fed. Rep. of Germany

[73] Assignee: Siemens Aktiengesellschaft, Berlin & Munich, Fed. Rep. of Germany

[21] Appl. No.: 182,472

[22] Filed: Aug. 28, 1980

[30] Foreign Application Priority Data

Oct. 25, 1979 [DE] Fed. Rep. of Germany ....... 2943143

[51] Int. Cl.³ .......................................... H01L 27/14
[52] U.S. Cl. .................................. 357/30; 357/24 LR
[58] Field of Search ............................. 357/30, 24 LR

[56] References Cited

U.S. PATENT DOCUMENTS

| 4,100,672 | 7/1978 | King | 357/24 LR |
|---|---|---|---|
| 4,139,784 | 2/1979 | Sauer | 357/24 LR |
| 4,142,198 | 2/1979 | Finnila | 357/24 LR |
| 4,155,094 | 5/1979 | Ohba et al. | 357/24 X |
| 4,275,407 | 6/1981 | Lorenze, Jr. | 357/24 LR |
| 4,316,205 | 2/1982 | Aoki | 357/30 |
| 4,318,115 | 3/1982 | Yoshikawa et al. | 357/30 |

*Primary Examiner*—Martin H. Edlow
*Attorney, Agent, or Firm*—Hill, Van Santen, Steadman, Chiara & Simpson

[57] ABSTRACT

An x-y infrared CCD sensor employing the photoelectric effect as in a p-doped semiconductor substrate of silicon with an n+pn diode as the infrared sensor element with a three layer structure in the vertical direction in the semiconductor substrate and a n-channel charge coupled device shift register. The device has a metal-oxide-semiconductor storage electrode directly adjacent to the n-region of the three layer structure. The device is manufactured by masked ion implantation with the doping density for the three layer sequence such that the doping density for the layer operating as the emitter is greater than the doping density for the layer operating as a base, which in turn is greater than the doping density for the layer operating as the collector.

5 Claims, 6 Drawing Figures

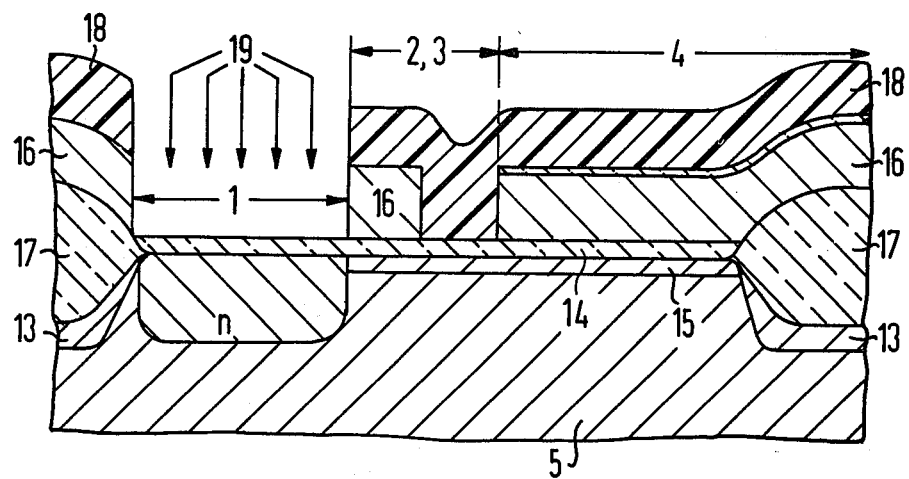
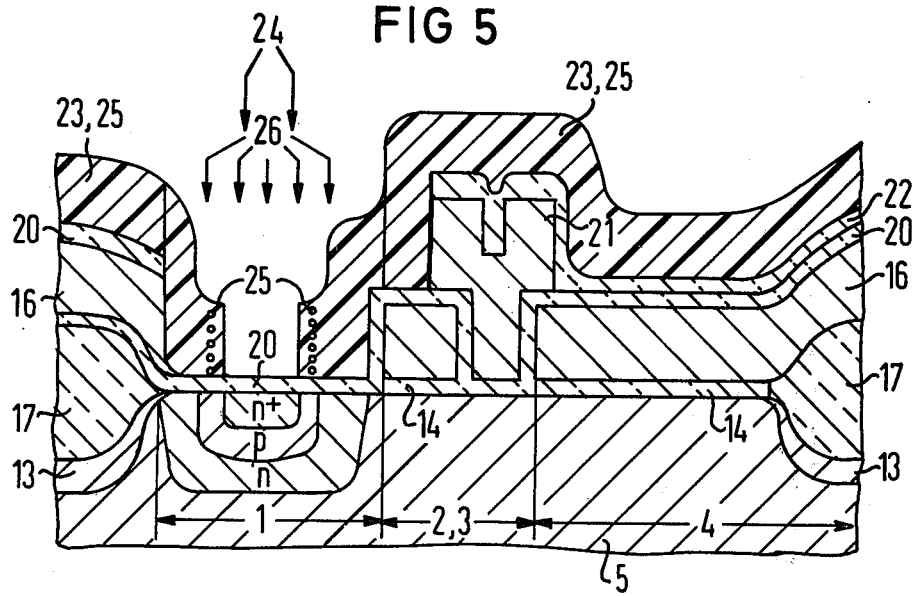

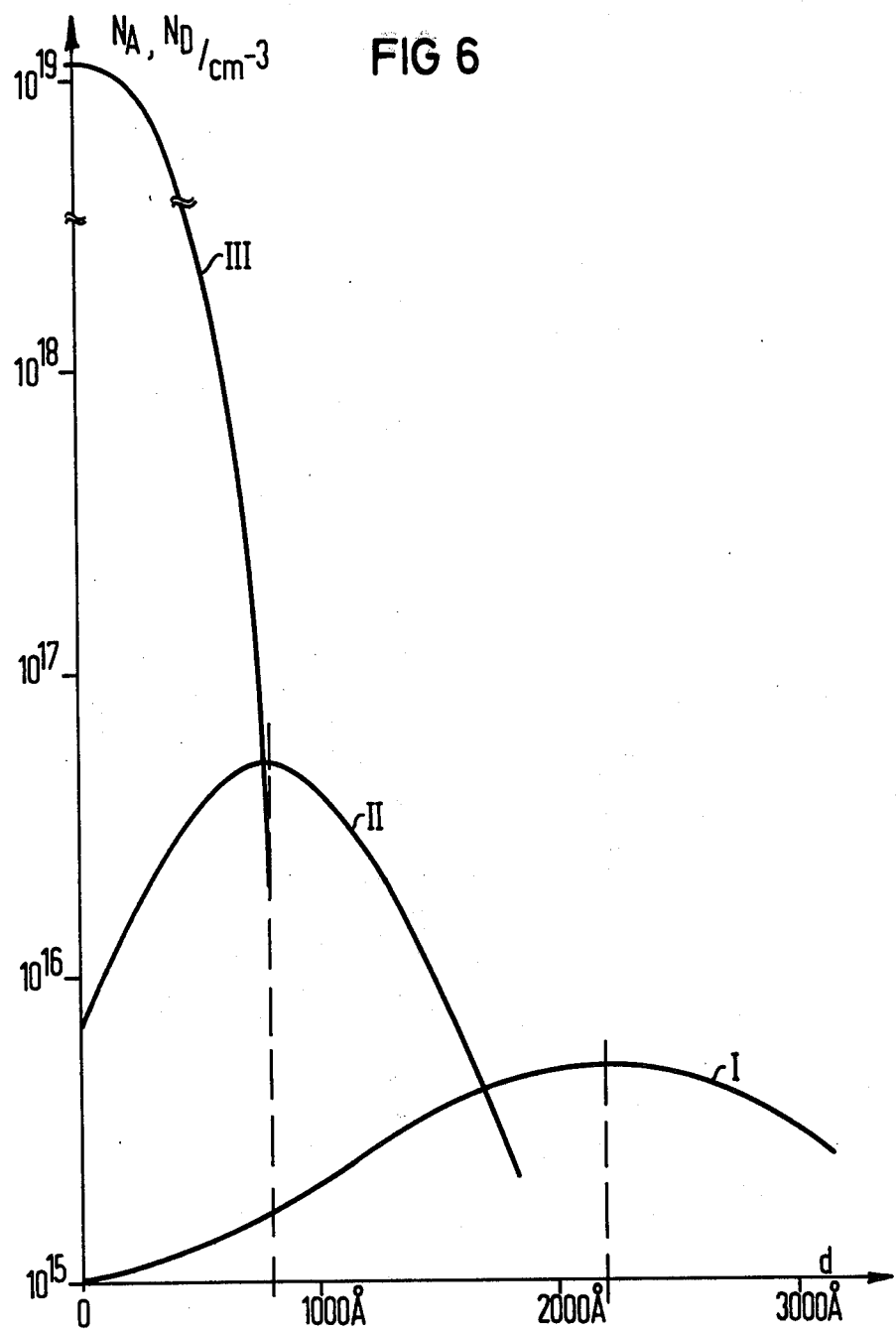

X-Y INFRARED CCD SENSOR AND METHOD FOR MAKING SAME

BACKGROUND OF THE INVENTION

The present invention relates to x-y infrared CCD sensors and methods for making same, and in particular to such sensors and methods employing the photoelectric effect.

It is well known in the art to employ sensors functioning according to the photoelectric effect for the detection and measurement of infrared radiation. Radiation detection occurs due to the interaction of the incident radiation and electrons in the lattice. Energy quanta of the incident radiation excite electrons in the sensor to a higher energy level. According to quantum theory, the energy contained in radiation at a wavelength $\lambda$ is proportional to $1/\lambda$.

For extrinsic silicon, photoconduction resulting from incident photon energies smaller than bandgap is caused by ionization of foreign atoms in the silicon. For such semiconductors, the critical wavelength at which such semiconductors are sensitive is determined not by the bandgap, but rather by the ionization energy of the donors or, of the acceptors, depending upon the doping of the semiconductor. Conventional sensors employ silicon with a gallium doping for the wavelength range from 8 through 12 $\mu$m and silicon with an indium or thallium doping for the wavelength range from 3 through 5 $\mu$m. As a result of the low ionization energy for such materials, substantial ionization of the foreign atoms already occurs in such devices at room temperature. This is because the conductivity of such crystals is very high even without irradiation thereof. Moreover, incident radiation encounters few ionizable foreign atoms and therefore causes little or no measurable increase in conductivity. Such sensors are therefore conventionally operated at low temperatures thereby requiring a cooling of the device such as by liquid nitrogen or liquid helium. The apparatus for cooling such devices is extremely expensive, and for some potential users is prohibitively expensive.

An infrared sensitive charge coupled device employing compound semiconductors with small bandgap, such as mercury-cadmium-telluride crystals (Hg-Cd-Te), as the light-sensitive element is known from an article by D. D. Buss et al., IEDM Meeting Report 1978 at pages 496-500. A liquid nitrogen coolant is still required for this device. Moreover, the manufacture of such a component for a sensor and charge coupled device consisting of compound semiconductors is very difficult and requires a significant technological outlay. Charge coupled devices with transmission losses in the range of $\epsilon = 5 \times 10^{-4}$ have hitherto been successfully manufactured only in the above mercury-cadmium-telluride combination. Other semiconductor combinations described in the above-identified article are indium antimonide, gallium-indium-antimonide-lead-telluride and lead-tin-telluride.

SUMMARY OF THE INVENTION

It is an object of the present invention to provide an x-y charge couple device sensor with good infrared sensitivity in the wavelength range of 3 through 5 $\mu$m and 8 through 12 $\mu$m.

It is a further object of the present invention to provide such a sensor which guarantees a high integration density due to its inherent structure.

It is another object of the invention to provide such a sensor which can be operated at room temperature or by a simplified means of cooling such as Peltier elements, thereby eliminating the necessity of cooling with liquid air.

Finally, it is an object to provide such a sensor which can be manufactured in relatively simple technology.

The above objects are inventively achieved in an infrared sensitive charge coupled device sensor employing the combination of an n-channel charge coupled device disposed in a p-doped semiconductor substrate of silicon with an n+pn diode functioning as the infrared sensor element, and having a three layer structure in the vertical direction in the semiconductor substrate as the diode. A metal-oxide-semiconductor storage electrode is disposed directly adjacent to the n-region of the three layer structure.

The above structure may be manufactured in double polysilicon technology with the diode comprised of the three layer structure having a center layer functioning as a base which is selected so thin that at the specified doping density for this layer the zone of the layer is already depleted of free charge carriers without the necessity of applying a voltage thereto. Such a result is achieved with a central layer having a thickness of less than 75 nm.

According to a further embodiment of the invention the three layer structure is generated by means of ion implantation with phosphorous and boron, according to the relationship $N_E > N_B > N_C$ whereby $N_E$, $N_B$ and $N_C$ are the respective doping densities of the layers operating as the emitter, the base and the collector. Such a diode is described in German OS 28 00 820.

By the employment of such a diode in the inventive arrangement, only three additional implantation steps are required for manufacturing the sensor. The cooling can be undertaken electrically with Peltier elements, such as may be readily purchased from various sources. If current is supplied through the connection of two metallic conductors a cooling of down to $-30°$ C. can be achieved with the suitable current direction.

DESCRIPTION OF THE DRAWINGS

FIG. 4 is a sectional view showing masking for manufacturing the device shown in FIGS. 2 and 3.

FIG. 5 is a sectional view showing further steps for the manufacture of the device shown in FIGS. 2 and 3.

FIG. 6 shows implantation profiles for the regions of the n+pn diode for achieving the desired infrared sensitivity.

DESCRIPTION OF THE PREFERRED EMBODIMENTS

Figure 1:
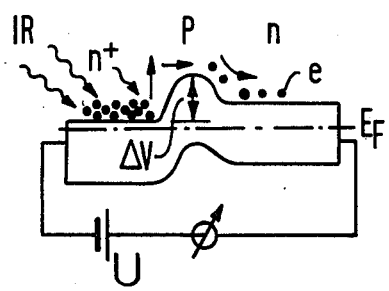
FIG. 1 is a schematic illustration of the manner of functioning of an n+pn diode employed in the present invention.

An n+pn diode is schematically represented in FIG. 1 as having a potential barrier of a height $\Delta V$ with the width of the potential barrier or threshold being adjustable by selected doping, geometry and applied voltage.

The line referenced at $E_F$ represents the Fermi level of the device. In the absence of exposure to radiation, an equilibrium of the electron flow from the n+ to the n-region results. If the device is exposed to infrared radiation IR, an additional electron flow e flows over the barrier as represented by the arrows due to free charge carrier absorption in the n+ region of highest concentration.

Figure 2:
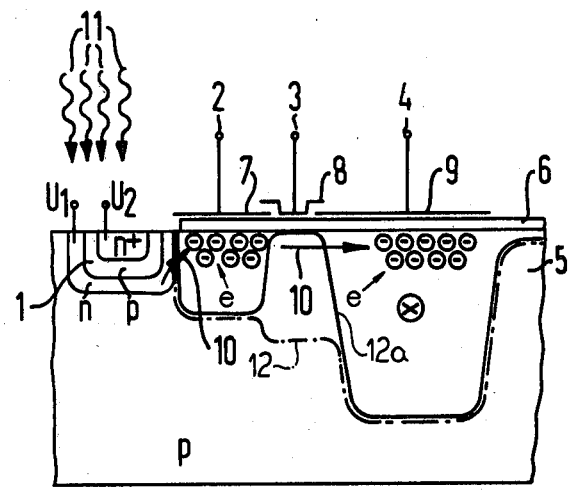
FIG. 2 is a sectional view of a sensor element constructed in accordance with the principles of the present invention showing the surface potential thereof.

Such charge carriers, as shown in FIG. 2, are utilized in the present invention as the input to a surface charge coupled device. A diode 1, of the type shown in FIG. 1, is generated with an n+pn structure in the vertical direction in a substrate 5 having a p-doping. A metal-oxide-semiconductor storage electrode 7, having a terminal 2, is directly adjacent to the n region, the electrode 7 being connected to a suitable clock pulse sequence for integrating the electrons e from the diode 1, serving as the sensor, generated as a result of the infrared radiation 11. This charge is then transferred into the charge coupled device transfer channel by means of a gate 8 which is supplied at a terminal 3 with a suitable clock pulse sequence. The transfer channel is covered with an array of closely spaced MOS capacitors, one electrode 9 supplied at a terminal 4 is shown when the clock voltage is high.

The electrodes are disposed in a conventional manner on the substrate 5 with a thin insulating layer 6 between the electrodes and the substrate 5. Such a structure is manufactured by conventional metal-oxide-semiconductor technology with the electrodes deposited on the insulator 6 grown by oxidation of the semiconductor surface. The principle of operation of the charge coupled device corresponds to a series connection of capacitors in which an information input at the beginning of each chain is shifted from one capacitor to the next by means of suitably phased clock pulse voltages. The arrow ⊗ in FIG. 2 indicate the charge transfer.

Figure 3:
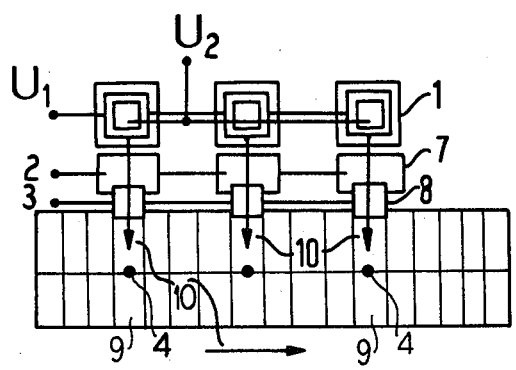
FIG. 3 is a plan elevational view of the circuit shown in FIG. 2.

As further shown in FIG. 2, the surface potential at the interface of the substrate 5 and thioxide 6 is shown at 12 for charge integration under the storage electrode, and the readout operation into the CCD is referenced at 12. Charge transfer in the charge coupled device ensues perpendicular to the plane of the drawing, as indicated by the symbol ⊗. The format of a single-dimensional sensor is shown in FIG. 3, wherein common elements have been identified with identical reference numerals. A two-dimensional sensor can be manufactured by the same principle as a charge coupled device sensor with metal-oxide-semiconductor capacitors.

Transfer losses for the charge coupled device shown in FIGS. 2 and 3 are in the range of $\epsilon = 2 \times 10^{-5}$. This allows the manufacture of large sensors with a high yield. Cooling of the device is achieved in a relatively simple manner, such as by the use of Peltier elements.

The structure shown in FIGS. 2 and 3 has the further advantage of facilitating manufacture thereof in a very simple manner. This method will be described with the aid of FIGS. 4 and 5, with FIG. 6 showing implantation profiles for the n+pn diodes. The penetration depth d is shown in the abscissa and the carrier concentration for acceptors $N_A$ or donors $N_D$ is shown on the ordinate.

FIG. 4 shows a sectional view of a partially completed device after the known process steps in conventional double polysilicon technology have been undertaken such as mask oxidation, referenced at 17, back side etching, gettering, nitride deposition, field implantation, represented at 13, locos mask removal, gate oxidation-1 (~500 Å) referenced at 14, channel implantation, referenced at 15, polysilicon-1-deposition, referenced at 16, polysilicon-1-doping, masking and polysilicon-1-etching. Such steps are known in the art and need not be discussed in greater detail herein.

Until now, in addition to the conventional CCD structure the storage electrode and the transfer electrode were realized and are shown in FIGS. 4 and 5.

Still referring to FIG. 4, the entire area of the device after the above conventional steps have been carried out is covered with a mask of photosensitive resist 18, except for those areas which are to be diode (sensor) regions, referenced at 1. A deep implantation, represented by the arrows 19, of the n region of the diode 1 is then undertaken, whereby phosphorous ions are implanted in the p-doped substrate 5 (2 through 20 ohm-cm = $7 \times 10^{14}$ through $7 \times 10^{15}$ cm$^{-3}$) with an acceleration voltage of 180 kV, and an implantation dose of $10^{10}$ through $10^{11}$ cm$^{-2}$ = $10^{15}$ – $10^{16}$ cm$^{-3}$. The mask of photosensitive resist 18 prevents through-implantation of phosphorous into the charge coupled device area, referenced in FIG. 5 at 2, 3 and 4.

After this first additional masking and implantation, the polysilicon process is continued by the following known steps of gate oxidation-2 (500 Å) referenced at 20, polysilicon-2-deposition, referenced at 21, polysilicon-2-doping, masking and polysilicon-2-etching (whereby the diode regions are retained). This is followed by the source/drain implantation, reoxidation, and deposition of the isolation oxide 22.

Further steps in the inventive method are shown in FIG. 5. After etching free of the diode region up to the gate oxide-2 layer 20, an additional mask of photosensitive resist 25 is applied for the definition of the p-region of the diode 1. The mask of photosensitive resist 25 terminates at the regions represented by the dots 25 above the diode region 1. Implantation of boron, represented by the arrows 26, then occurs with an energy of 40 keV. The dose is in the region of $10^{11}$ through $2 \times 10^{13}$ cm$^{-2}$ = $10^{16}$ through $2 \times 10^{18}$ cm$^{-3}$.

The n+ region of the diode 1 is now defined with a further mask of photosensitive resist 23. Implantation with phosphorous, represented by the arrows 24, is undertaken at an energy in the range of 5 to 50 keV with a dose of $10^{14}$ through $10^{15}$ cm$^{-2}$ = $10^{19}$ through $10^{20}$ cm$^{-3}$. This last implantation may, however, be undertaken with arsenic instead.

The device is then completed in a known manner by the remaining process steps of double polysilicon technology, such as tempering of the isolation oxide, contact hole masking and etching, aluminium/copper-silicon vaporization, etching, passivation and contacting. Such method steps are known in the art and are not specifically shown in FIG. 5.

Implantation profiles for the implantation steps represented by the arrows 19, 24 and 26 in FIGS. 4 and 5 are shown in FIG. 6. Curve I illustrates the doping for the n region, curve II shows the doping for the p-region, and curve III shows the doping profile for the n+ region.

Although modifications and changes may be suggested by those skilled in the art, it is the intention of the inventors to embody within the patent warranted hereon all changes and modifications as reasonably and properly come within the scope of their contribution to the art.

We claim as our invention:
1. An infrared radiation-sensitive device in a p-doped silicon substrate comprising:

an infrared sensor consisting of an n+pn diode having a three-layer structure expanding in the vertical direction in said substrate;

said layers of said diode in said three-layer structure respectively functioning as an emitter, a base and a collector, said emitter layer having a doping density greater than the doping density of said base layer, and said doping density of said base layer being greater than the doping density of said collector layer, said base layer being the central layer in said three-layer structure and having a thickness such that for a selected doping of said central layer a region of said central layer is depleted of free charge carriers with no voltage applied thereto;

an n-channel charge coupled device in said substrate having an array of clocked transfer electrodes disposed on an insulating layer above said substrate; and a clocked metal-oxide-semiconductor storage electrode disposed on said insulating layer between said sensor and one of said transfer electrodes for periodically transferring charge generated in said sensor by incident infrared radiation to said charge coupled device.

2. The device of claim 1 wherein said diode has a central layer in said three-layer structure functioning as a base which has a thickness which is less than 75 nm.

3. The device of claim 1 wherein the layers of said diode in said three-layer structure are realized by ion implantation with boron and with phosphorous or arsenic.

4. The device of claim 1 wherein said substrate has a carrier concentration in the range of $7 \times 10^{14}$ cm$^{-3}$ through $7 \times 10^{15}$ cm$^{-3}$.

5. The device of claim 1 wherein the layers of said diode in said three-layer structure function as an emitter, a base and a collector and wherein the doping density of the emitter layer is in the range of $10^{19}$ cm$^{-3}$ through $10^{20}$ cm$^{-3}$ and the doping density of the base layer is in the range of $10^{16}$ cm$^{-3}$ through $2 \times 10^{18}$ cm$^{-3}$ and the doping density of the collector layer is in the range of $10^{15}$ cm$^{-3}$ through $10^{16}$ cm$^{-3}$.

* * * * *